United States Patent
Chang

(10) Patent No.: US 7,098,759 B2
(45) Date of Patent: Aug. 29, 2006

(54) HARMONIC SPURIOUS SIGNAL SUPPRESSION FILTER

(75) Inventor: Yu-Chen Chang, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 0 days.

(21) Appl. No.: 10/967,202

(22) Filed: Oct. 19, 2004

(65) Prior Publication Data

US 2006/0082424 A1    Apr. 20, 2006

(51) Int. Cl.
*H01P 1/203* (2006.01)
*H03H 7/01* (2006.01)

(52) U.S. Cl. .................................. 333/204; 333/185
(58) Field of Classification Search ............... 333/203, 333/204, 175, 176, 185
See application file for complete search history.

(56) References Cited

U.S. PATENT DOCUMENTS

| | | | |
|---|---|---|---|
| 5,618,777 A * | 4/1997 | Hey-Shipton et al. ...... | 333/185 |
| 5,929,729 A * | 7/1999 | Swarup ...................... | 333/246 |
| 6,191,666 B1 * | 2/2001 | Sheen ......................... | 333/185 |
| 6,587,018 B1 * | 7/2003 | Meck et al. ................ | 333/175 |
| 6,792,299 B1 * | 9/2004 | Ye .............................. | 333/185 |
| 2003/0155990 A1 * | 8/2003 | Ye .............................. | 333/99 S |

FOREIGN PATENT DOCUMENTS

JP          2002290186 A  * 10/2002

* cited by examiner

*Primary Examiner*—Seungsook Ham
(74) *Attorney, Agent, or Firm*—Bacon & Thomas, PLLC

(57) ABSTRACT

The present invention is to provide a harmonic spurious signal suppression filter, which comprises microstrip lines disposed on a printed circuit board of a wireless network product, wherein one end of a microstrip input end is perpendicularly connected to one end of a first microstrip line, one end of a microstrip output end is perpendicularly connected to one end of a fourth microstrip line, the first and fourth microstrip lines are interwovenly arranged in an interdigital finger form, a second microstrip line is extended from both the microstrip input and output ends, and each end of the second microstrip line corresponding to the location of the first and fourth microstrip lines is connected to a third microstrip line of a meandering shape.

2 Claims, 3 Drawing Sheets

HARMONIC SPURIOUS SIGNAL SUPPRESSION FILTER

FIELD OF THE INVENTION

The present invention relates to a harmonic spurious signal suppression filter, and more particularly to a harmonic spurious signal suppression filter comprising microstrips fabricated on a printed circuit board of a wireless network product for suppressing high frequency harmonic spurious signals generated from a nonlinear distortion of a power amplifier of the wireless network product and largely reducing the size of the filter.

BACKGROUND OF THE INVENTION

In recent years, the increasing market demand on wireless network products has pushed the development of wireless local area network (wireless LAN) to a much higher level. Particularly, the IEEE 802.11 protocol established in the year 1997 provides many new functions in the wireless LAN communications and a solution for communicating between wireless products of different brands, which opens up a new milestone for the development of wireless LAN applications. This protocol sets the direction of wireless LAN development to a single chip solution running on a kernel device. This largely reduces the cost of wireless technology, thus making the wireless LAN technology being applicable to various kinds of wireless products.

Moreover, in order to satisfy the compactness requirement of wireless network products in the market, the manufacturers thereof must design the circuit layout of the wireless network products in a strictly limited space. Consequently, when a wireless network product is working under a high power condition, harmonic waves of high frequencies are generated due to the nonlinear properties of the active components, thereby causing electromagnetic interference (EMI). In order to solve the problem described above, many developed countries have established statutory restrictions to limit the import or usage of such wireless network products. For this reason, the manufacturers of such wireless network products must include a filter therein to comply with the statutory requirements and to suppress the generated noise of harmonic waves of high frequencies, when designing their wireless network products, especially when the power is amplified. The harmonic waves of high frequencies of the manufactured wireless network products can thus meet the statutory requirements of all countries.

Let's take a printed circuit of a wireless network product working under a frequency of 2.4 GHz as an example, as shown in FIG. 1. In order to reduce the manufacturing cost and space occupied by the filter, a low pass filter having a size of 133×300 mil$^2$ disposed after the power amplifier is normally fabricated on the printed circuit board. The filter is formed directly on the extra space of the printed circuit board, which is left out from the wiring scheme of the microstrip lines. The filter comprises a microstrip input end 10. One end of the microstrip input end 10 is perpendicularly connected to one end of a first microstrip line $Z_1$. The filter further comprises a microstrip output end 15. One end of the microstrip output end 15 is perpendicularly connected to one end of a third microstrip line $Z_3$. The first microstrip line $Z_1$ and the third microstrip line $Z_3$ are mutually spaced and symmetrically arranged wherein a second microstrip line $Z_2$ is connected therebetween. The second microstrip line $Z_2$ is in a meandering shape, which is being disposed between the first and the third microstrip lines $Z_1$, $Z_3$. In addition, the two ends of the second microstrip line $Z_2$ are perpendicularly connected to the microstrip input line 10 and the microstrip output line 15. The necessary low pass filter is thus formed to effectively suppress the noise of harmonic waves of high frequencies, which is generated from the power amplifier due to nonlinear distortions.

One can use the low pass filter shown in FIG. 1 to filter the wave signals generated from a wireless network product at a working frequency of 2.4 GHz. The resultant noise is measured and illustrated in FIG. 2. As shown, the insertion loss at 2.4 GHz is approximately 0.0751 dB, while the suppression is approximately 27.73 dB at a double frequency of 4.8 GHz. However, the first microstrip line $Z_1$ and the third microstrip line $Z_3$ of such low pass filter occupy quite a large area on the printed circuit board. This hinders the printed circuit board of wireless network products from further shrinking down to a smaller size. Therefore, the problem of how to shrink down the size of wireless network products without increasing the manufacturing cost and yet satisfying the related statutory requirements is a very important issue to solve.

SUMMARY OF THE INVENTION

Since the conventional wireless network product described above is disadvantageous in that the size of the low pass filter for suppressing the harmonic spurious signal cannot be reduced, the inventor of the present invention has developed a harmonic spurious signal suppression filter, based on his many years of practical experiences in the art of wireless network product. The filter that is fabricated on a printed circuit board of the wireless network product can indeed solve the problems described above. When the printed circuit board of the wireless network product is fabricated, the filter comprising a microstrip input end, a first microstrip line, a second microstrip line, a third microstrip line, a fourth microstrip line and a microstrip output end is disposed on the printed circuit board. Therefore, the size of the filter can largely be reduced without the need of employing additional high frequency filters. The high frequency harmonic spurious signal generated due to the nonlinear distortion of the power amplifier of the wireless network product is also suppressed.

Therefore, one object of the present invention to provide a microstrip harmonic spurious signal suppression filter in winch one end of the microstrip input end is perpendicularly connected to one end of the first microstrip line, and one end of the microstrip output end is perpendicularly connected to one end of the fourth microstrip line. (referred to in the claims as an "additional" microstrip line). The first microstrip line and the fourth microstrip line are interwovenly arranged in an interdigital finger form. The second microstrip line is extended from both the microstrip input end and the microstrip output end. Each end of the second microstrip line corresponding to the location of the first and the fourth microstrip lines is connected to the third microstrip line of a meandering shape. Accordingly, a filter using only the limited remaining space on the printed circuit board is formed, which can largely suppress the high frequency harmonic spurious signal generated from the nonlinear distortion of the power amplifier of the wireless network product without the need of employing any additional high frequency filter. Therefore, the size of the printed circuit board and the manufacturing cost can be reduced and a more compact wireless network product is manufactured.

DETAILED DESCRIPTION OF THE PREFERRED EMBODIMENTS

Figure 3:
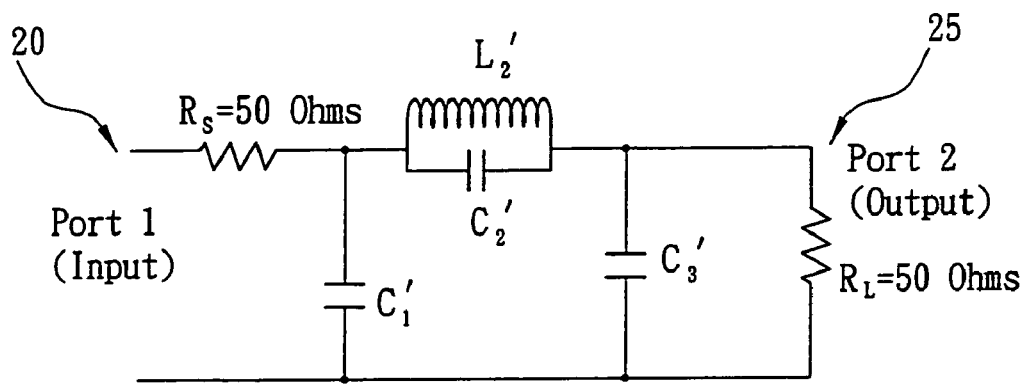
FIG. 3 illustrates a equivalent circuit diagram of a three stage pi-type low pass filter.

In one preferred embodiment of the present invention, a filter comprised of a microstrip line is directly fabricated on the extra space of a printed circuit board of a wireless network product. The filter can effectively suppress the harmonic spurious signal of high frequency generated due to the nonlinear distortions of the power amplifier of the wireless network products. Taking the wireless network product of 2.4 GHz working frequency as an example, if one considers the three stage pi-type low pass filter of 1 dB equal ripple as a prototype, as shown in FIG. 3, the terminal resistance $R_S$ of the input end 20 and the terminal resistance $R_L$ of the output end 25 are both 50 ohms. According to the book entitled MICROSTRIP FILTERS FOR RF/MICROWAVE APPLICATIONS, written by Jia-Shyeng Hong and M. J. Lancaster, published by John Wiley and Sons, Inc., 2001, one can find the values of $g_1$=0.7199, $g_2$=0.7167, $g_3$=0.3379, $g_4$=0.7199, where $C_n' = C_n/(R_0 W_C)$, and $L_n = (R_0 L_n)/W_C$.

The equivalent capacitance and inductance of the lumped element are $C_1' = C_3' = g_1/(50*2pi*2.4 \text{ GHz}) = 954.855$ (fF), $L_1' = (50*g_2)/(2 \text{ pi}*2.4 \text{ GHz}) = 2.37622$ (nH), and $C_2' = g_3/(50*2 \text{ pi}*2.4 \text{ GHz}) = 448.142$ (fF).

The equivalent impedances of the distributed elements of the microstrip line are $Z_C = 1/C_n$, and $Z_C = L_n$.

That is:

$z_1 = z_4 = 1/(ZC_1) = 1/(ZC_4) = 1/g_1 = 1.3891$, $z_2 = Z L_1 = g_2 = 0.7167$, and $z_3 = 1/(ZC_3) = 1/g_3 = 2.9595$.

Therefore, the impedances of the first, second, third and fourth microstrip lines $Z_1$, $Z_2$, $Z_3$ and $Z_4$ included in the low pass filter are $Z_1 = Z_4 = z_1 R_0 = 69.455$ (Ohms), $Z_2 = z_2 R_0 = 35.835$ (Ohms), and $Z = z_3 R_0 = 147.975$ (Ohms).

Figure 1:
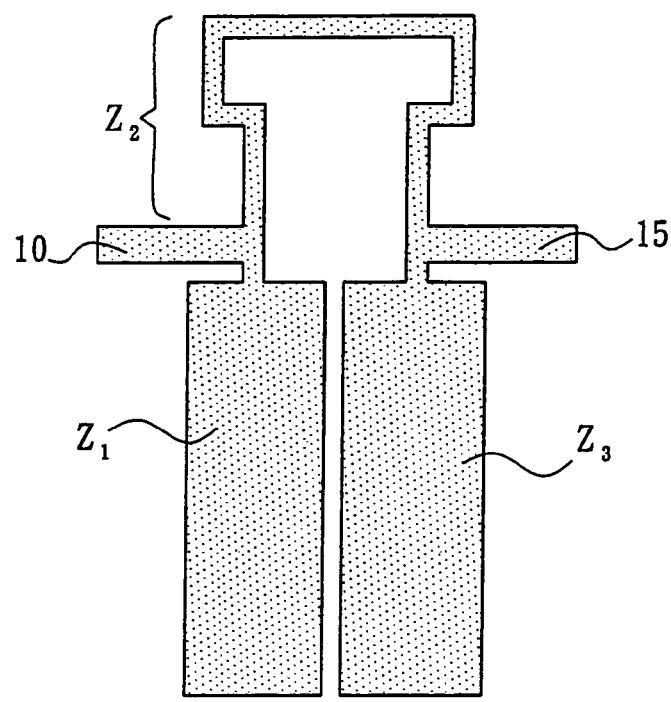
FIG. 1 schematically illustrates a microstrip line of a conventional low pass filter working under the 2.4 GHz frequency.
Figure 2:
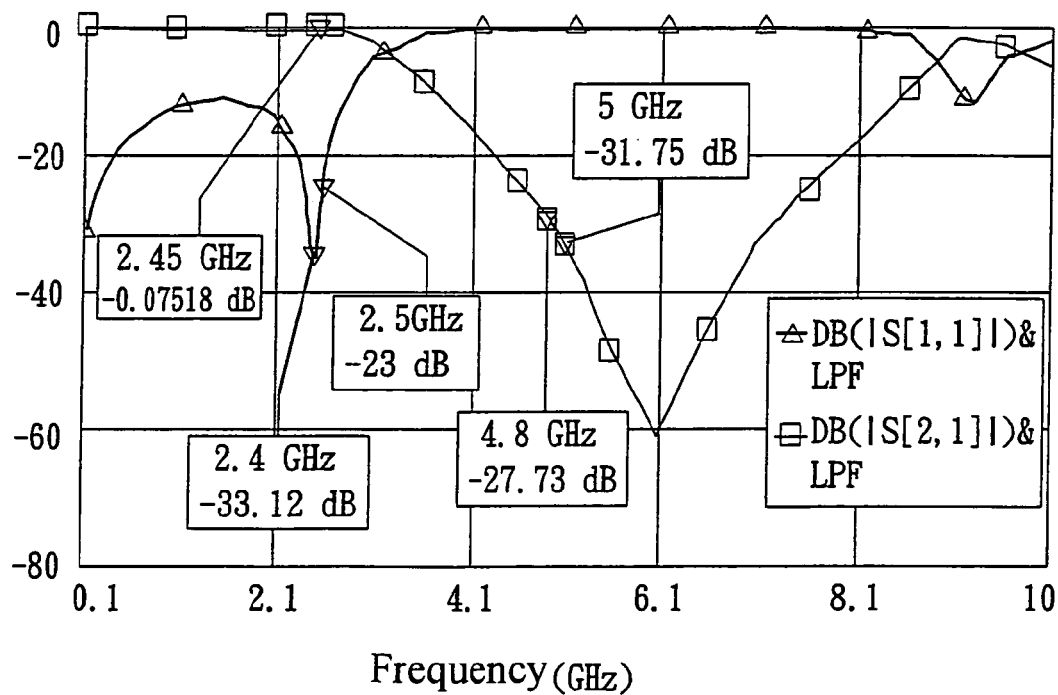
FIG. 2 is a frequency response diagram after wave signals are filtered through the conventional low pass filter shown in FIG. 1.
Figure 4:
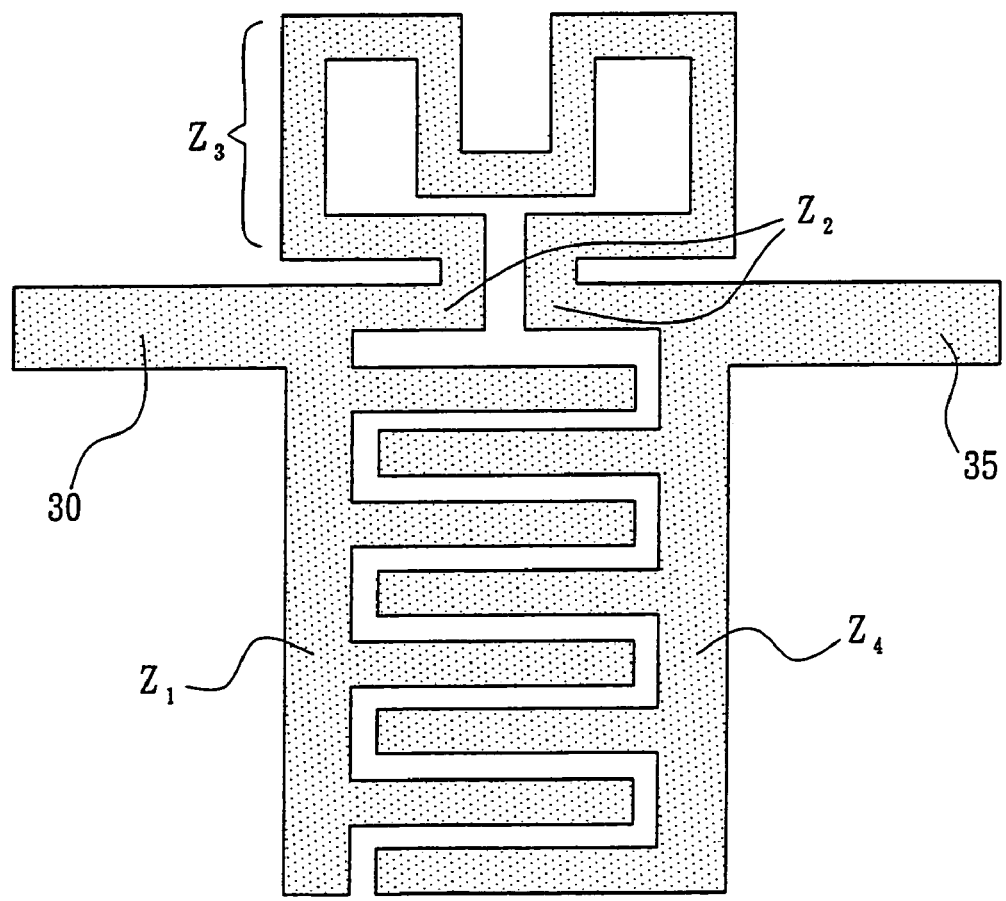
FIG. 4 illustrates a microstrip line of a low pass filter in accordance with one preferred embodiment of the present invention.
Figure 5:
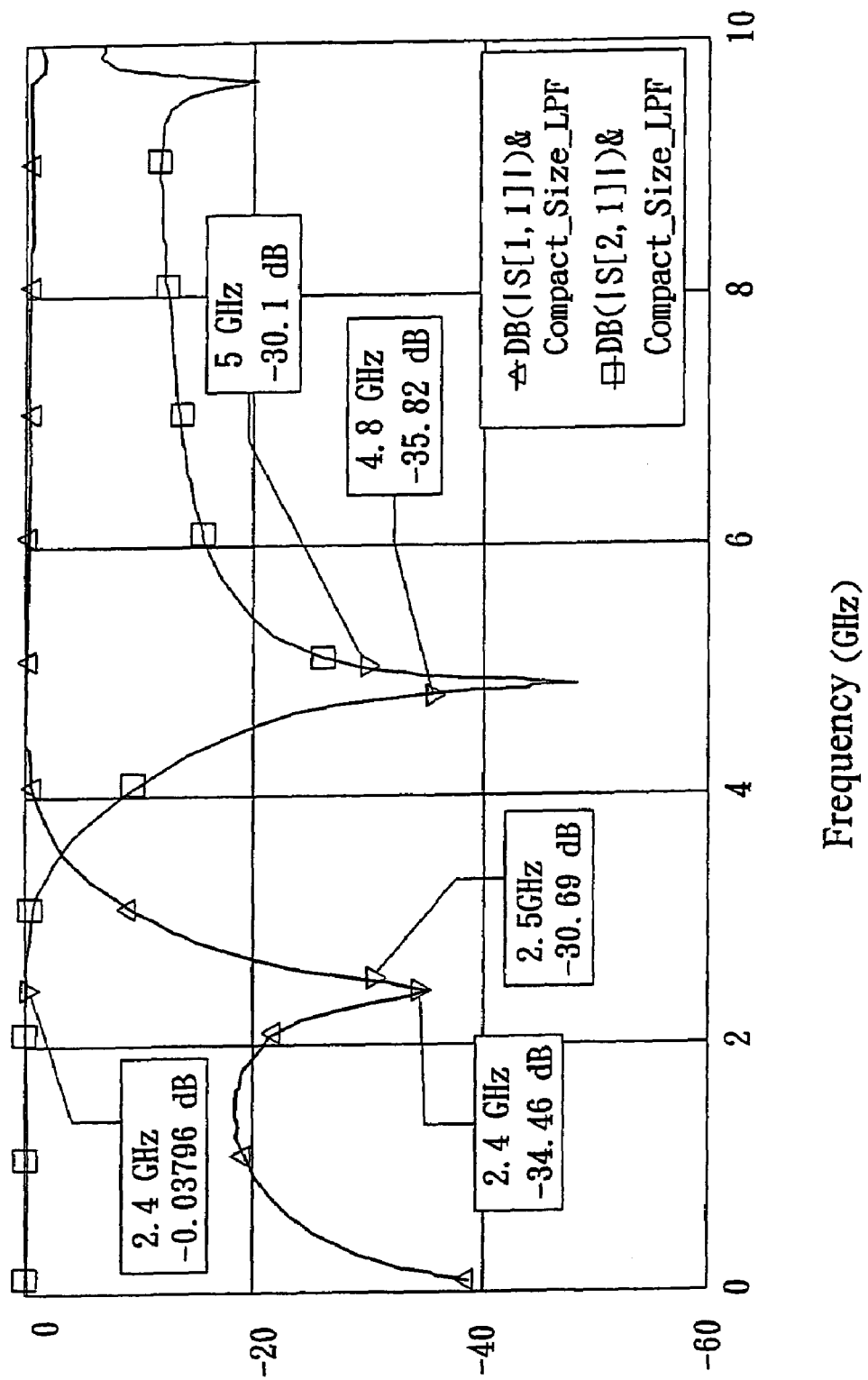
FIG. 5 is a frequency response diagram after wave signals are filtered through the low pass filter shown in FIG. 3.

Meanwhile, the first and the fourth microstrip lines $Z_1$ and $Z_4$ are interwovenly arranged in an interdigital finger form, thereby forming the microstrip lines for the low pass filter, as shown in FIG. 4. One end of the microstrip input end 30 is perpendicularly connected to one end of the fourth microstrip line $Z_4$. The first microstrip line $Z_1$ and the fourth microstrip line $Z_4$ are interwovenly arranged in an interdigital finger form. The second microstrip line $Z_2$ is extended from both the microstrip input end 30 and the microstrip output end 35. The third microstrip line $Z_3$ is formed in a meandering shape, which connects to two ends of the second microstrip line $Z_2$ corresponding to the first microstrip line $Z_1$ and the fourth microstrip line $Z_4$, respectively. When feeding the high power signals generated from the wireless network product into the input end of the microstrip intput end 30 of the low pass filter, the frequency response is measured from the output end of the microstrip output end 35 of the low pass filter, which is illustrated in FIG. 5. As shown, the insertion loss at 2.4 GHz is approximately 0.03796 dB, which is smaller than that described in connection with FIG. 1 for the conventional filters. However, the suppression of double frequency harmonic wave at 4.8 GHz is 35.82 dB, which is larger than that of the conventional filters as shown in FIG. 1.

It is appreciated that the meandering shape of the second microstrip line $Z_2$ and the third microstrip line $Z_3$ described above is only of a preferred embodiment of the present invention. In light of the detailed descriptions given above, any person having ordinary skill in the art can design the microstrip line connecting the input end 30 and the output end 35 in any possible meandering shape. All such microstrip lines of meandering shape connecting the input end 30 and the output end 35 are referred to as a microstrip line of meandering shape in the present invention.

Accordingly, the filter of the present invention is directly formed on the printed circuit board when fabricating the printed circuit board of the wireless network product. The first microstrip line $Z_1$ and the fourth microstrip line $Z_4$ are interwovenly arranged and spaced in an interdigital fingers form. The size of the filter is only about 97×190 mil2, which is 63.8% smaller than that of the conventional filter shown in FIG. 1. This largely reduces the cost and the area required to fabricating the printed circuit board. Therefore, a more compact wireless network product is produced. Furthermore, interwovenly arranged first microstrip line $Z_1$ and the fourth microstrip line $Z_4$ have a longer effective coupling length. Hence, a larger capacitance is obtained even when the printed circuit board is smaller in size. Therefore, the high frequency harmonic spurious signal in the wireless network product is effectively suppressed.

While the invention has been described by means of specific embodiments, numerous modifications and variations could be made thereto by those skilled in the art without departing from the scope and spirit of the invention set forth in the claims.

What is claimed is:

1. A harmonic spurious signal suppression filter fabricated on a printed circuit board, comprising:
 a microstrip input end, one end of the microstrip input end connecting an input end of the filter;
 a first microstrip line, one end of the first microstrip line perpendicularly connecting the other end of the microstrip input end;
 a microstrip output end, one end of the microstrip output end connecting to an output end of the filter;
 an additional microstrip line, one end of the additional microstrip line perpendicularly connecting the other end of the microstrip output end, the additional microstrip line and the first microstrip line being interwovenly disposed in a interdigital finger form; and
 a meandering microstrip line, two ends of the meandering microstrip line respectively connecting the other ends of the input end and the output end, and extending from said one end of the first microstrip line and said one end of the additional microstrip line;
 wherein the meandering microstrip line further comprises a second microstrip line, the second microstrip line being extended from both the microstrip input end and the microstrip output end.

2. The filter of claim 1, wherein the meandering microstrip line further comprises a third microstrip line, the third microstrip line being formed in a meandering shape, which connects to two ends of a second micro strip line corresponding to the first microstrip line and the fourth microstrip line, respectively.

* * * * *